United States Patent [19]

Kawamura

[11] Patent Number: 5,202,620
[45] Date of Patent: Apr. 13, 1993

[54] APPARATUS FOR MEASURING THE TIME CONSTANT OF THE DIRECT-AXIS DAMPER OF A SYNCHRONOUS MACHINE

[75] Inventor: Mitsuhiro Kawamura, Nagasaki, Japan

[73] Assignee: Mitsubishi Denki Kabushiki Kaisha, Tokyo, Japan

[21] Appl. No.: 775,573

[22] Filed: Oct. 15, 1991

[30] Foreign Application Priority Data

Apr. 12, 1991 [JP] Japan .................................. 3-106505

[51] Int. Cl.⁵ .............................................. G01R 31/34
[52] U.S. Cl. ................................... 324/158 MG; 324/545
[58] Field of Search ................... 324/158 MG, 545; 340/648; 322/99

[56] References Cited

U.S. PATENT DOCUMENTS 3,651,402  3/1972  Leffmann ................... 324/158 MG

FOREIGN PATENT DOCUMENTS 62-79380  4/1987  Japan .
1-217279  8/1989  Japan .
2-304380  12/1990  Japan .

OTHER PUBLICATIONS

"Electrical Engineering Handbook" published by Institute of Electrical Engineers of Japan, Part 4.22, 1988.
"Institute of Electrical Engineers of Japan Technical Report," vol. 85, May 1968, §§6.11-6.14 B.

Primary Examiner—Ernest F. Karlsen
Attorney, Agent, or Firm—Burns, Doane, Swecker & Mathis

[57] ABSTRACT

An apparatus for measuring the time constant of the direct-axis damper of a synchronous machine is designed such that a voltage from a d.c. power source is applied by switching to armature windings of two phases, so that an armature current rises and thereafter it keeps a constant value. A current induced on a direct-axis damper diminishes at a moderate rate of the direct-axis damper time constant, and this decreasing current and the constant armature current flow inside the synchronous machine. In response to a change in the induction current on the direct-axis damper caused by the transition of the armature current to the steady state, a voltage induced on the field winding rises sharply and then falls gradually. The time length until the field winding voltage falls to a prescribed level is measured as the time constant of the direct-axis damper with such a measuring device as an electromagnetic oscilloscope.

19 Claims, 3 Drawing Sheets

APPARATUS FOR MEASURING THE TIME CONSTANT OF THE DIRECT-AXIS DAMPER OF A SYNCHRONOUS MACHINE

BACKGROUND OF THE INVENTION

1. Field of the Invention

The present invention relates to an apparatus for measuring the time constant of the direct-axis damper of a synchronous machine among machine parameters needed for the computation in its control operation based on vector control, the measurement being implemented in the stage of the stand-alone machine test during assembly of the machine in the factory.

2. Description of the Prior Art

There is no test method available for directly measuring the time constant of the direct-axis damper of a synchronous machine. For example, a publication "Procedure of Testing a Synchronous Machine, Part 1 through Part 4", published by The Institute of Electrical Engineers of Japan, does not describe any technique for directly measuring the time constant of the direct-axis damper of a synchronous machine. A method of indirect measurement is conceivable based upon treating the damper as a secondary conductor of an induction motor, measuring the input power in a lock test, the equivalent resistance which matches the input power is calculated and the direct-axis damper time constant is finally obtained from the ratio of the equivalent resistance to the armature reaction inductance which is evaluated separately. However, a model of the synchronous machine used in the control computation, which is the inherent purpose, does not match model of the synchronous machine in the indirect measuring method based on the conversion of input power, and therefore the direct-axis damper time constant cannot be determined.

Moreover, the damper time constant needed in the control computation is the time constant in a microscopic sense resulting from the treatment of unbalanced multi-phase windings formed of multiple conductor bars embedded in the core of magnetic poles of the synchronous machine. Accordingly, evaluating the inductance and resistance sequentially and calculating their ratio for obtaining the time constant, which is the case relevant to the usual concentrated circuit parameter system, cannot be applied to the present situation.

Conventionaly, synchronous machines have been used as generators and motors operated at constant revolving speeds. These machines are provided with dampers for a purpose of suppressing speed fluctuation and for the additional purpose of producing a starting torque by utilizing it as a cage rotor of induction motor. In such circumstances of dampers, it has not been necessary to known the value of the damper time constant, and accordingly there has been no need of measuring the damper time constant directly.

Due to the conventional affair of measuring method intended for the evaluation of the direct-axis damper time constant of a synchronous machine as described above, it has not been possible for the implementation of high-accuracy control called "vector control" to assess the damper time constant as one of machine parameters used by the controller. On this account, it has been necessary to have iterative operation tests for the machine and controller in combination thereby to improve control performance by narrowing the assessment of the time constant, resulting unfavorably in an excessive expenditure of time and cost for this test step.

Another problem is that the accurate evaluation of the direct-axis damper time constant is required at the stage of testing a machine alone immediately after it has been assembled in the factory, so that the optimal value of the machine time constant, which has a great effect on the accuracy of control computation, is set to the controller in order to accomplish high-accuracy control.

SUMMARY OF THE INVENTION

The present invention is intended to overcome the foregoing prior art problems, and its prime object is to provide an apparatus for measuring the time constant of the direct-axis damper of a synchronous machine capable of directly measuring the direct-axis damper time constant, which is one of the machine parameters used in the control computation, at a high accuracy and in a short time on a machine alone in the factory.

The measuring apparatus based on the present invention is designed such that a synchronous machine is made to have its rotor made stationary at the position where a direct-axis magnetomotive force is generated by current conduction between two armature windings of two phases, with a winding of remaining phase being opened, and the time length after the current having an approximate step waveform applied to the two windings has reached a certain value until a voltage induced on the field winding falls to a certain level is measured with a measuring means.

Other objects and features of the present invention will become apparent from the following detailed description of specific embodiments taken in conjunction with the accompanying drawings.

DESCRIPTION OF THE PREFERRED EMBODIMENT

Figure 1:
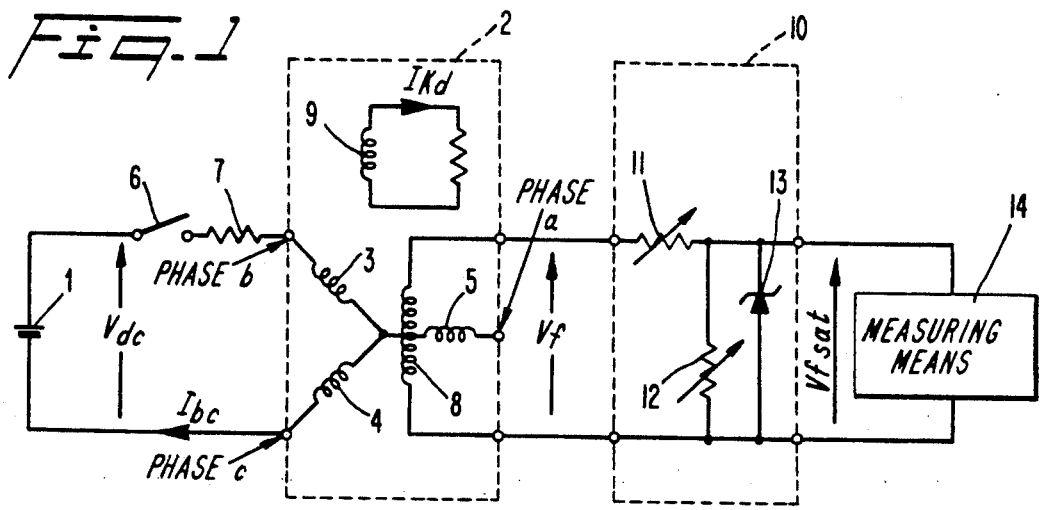
FIG. 1 a schematic diagram showing the apparatus for measuring the time constant of the direct-axis damper of a synchronous machine based on an embodiment of this invention.

An embodiment of the present invention will be described with reference to the drawings. In FIG. 1, indicated by 1 is a d.c. power source such as a d.c. generator, 2 is a synchronous machine (e.g., a.c. motor), and 3, 4 and 5 are 3-phase armature windings of the motor 2, of which the windings 3 and 4 are connected in series to the d.c. power source 1 through a switch 6 and a resistor 7, and another winding 5 is left open. Indicated by 8 is a field winding of the motor 2, 9 is a damper which causes the field winding 8 to produce an induction voltage, 10 is a saturation circuit consisting of resistors 11 and 12 and a constant-voltage diode (Zener) diode 13, and 14 is an electromagnetic oscilloscope used as a measuring means.

Figure 2:
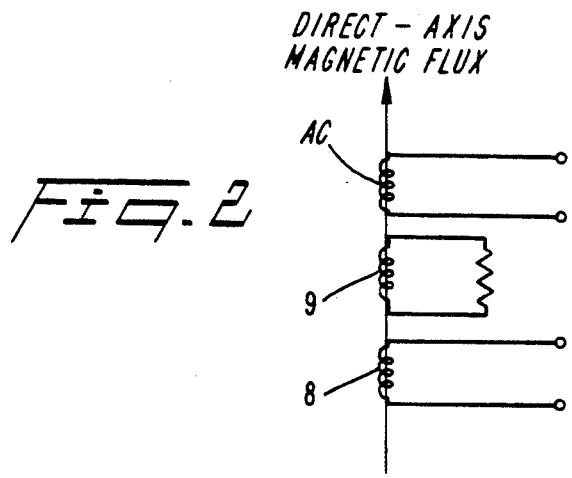
FIG. 2 is a schematic diagram showing the principle of measurement of the direct-axis damper time constant based on this invention.

Next, the operation of the above arrangement will be explained. First, the concept of the direct-axis damper time constant will be explained on FIG. 2. The damper 9 in a closed circuit configuration is given an initial value of direct-axis magnetic flux, with the armature winding AC and field winding 8 being left open. After the initial flux application, the magnetic flux and current in the damper will diminish at a rate determined by the time constant of the direct-axis damper. Although the model of damper shown in FIG. 2 is a single winding, it is actually made up of multiple conductor bars embedded in the core of magnetic poles. This invention is designed to evaluate the direct-axis damper time constant through the measurement of the time constant when the magnetic flux and current in the damper diminish.

If the above-mentioned principle were to be practiced intact, the direct measurement of the direct-axis damper time constant would be carried out as follows. Initially, the rotor is fixed at the position where the current conduction through the armature windings of phases b and c, with the a-phase winding being open, produces a direct-axis magnetomotive force. In this state, when the field winding 8 is opened and a d.c. current is conducted through the armature windings 3 and 4 (phases b and c), then the damper 9 is given a direct-axis magnetic flux.

In the steady state, when the armature current flowing through phases b and c is cut off, part of the magnetic flux produced by the armature windings 3 and 4 which intersects the damper 9 produces an induction current on the damper 9, and the magnetic flux and current of the damper diminish at a rate determined by the direct-axis damper time constant. The remaining component of the magnetic flux of the armature windings 3 and 4 which does not intersect the damper, i.e., the leakage magnetic flux, produces a transitional voltage when the current is cut off, and the magnitude of this transitional voltage will be determined from such an incident as the emergence of arc. Namely, the voltage induced across the armature windings 3 and 4 cannot be foreseen by computation, and it can even destroy the insulation. On this account, a current of a step waveform is supplied to the armature based on the fact that the current cutoff phenomenon is the superimposition of a negative step current on a d.c. current.

Next, the operation will be explained in more detail on FIG. 1. Initially, the rotor is fixed at the position where the current conduction through the armature windings 3 and 4 of phases b and c produces a direct-axis magnetomotive force. Specifically, a d.c. current is conducted to the armature windings of phases b and c, with the winding 5 being left open. At the same time, a d.c. current is fed to the field winding 8. The rotor is fixed at the position of equilibrium of the magnetic forces between the stator and rotor. With the rotor being placed at this position as shown in FIG. 1, a current conduction through phases b and c causes the generation of a direct-axis magnetomotive force.

When the switch 6 is closed and a d.c. voltage is applied between phases b and c through a resistor 7 of a sufficiently large resistance, the armature current $I_{bc}$ will rise with an approximate step waveform. In order for implementation of the test to be equivalent to the above-mentioned principle, the resistor 7 and the d.c. voltage $V_{dc}$ are desirably as large as possible so that the current waveform is close to a step function. In this case, prior calculation is needed so that a resulting excessive voltage induced across the field winding 8 of the motor 2 does not destroy the insulation. By adjusting the values of the resistor 7 and d.c. voltage $V_{dc}$, the rising waveform of the armature current $I_{bc}$ can be modified.

The voltage induced across the field winding 8 by being opened is recorded with an electromagnetic oscilloscope 14 by way of the saturation circuit 10 which consists of the resistors 11 and 12 and the Zener diode 13 shown in FIG. 1. The saturation circuit 10 works to cut a sharp component of the voltage induced in the field circuit immediately after the switch has been closed. By conducting the voltage through the saturation circuit 10, only a component of field induction voltage which diminishes at a moderate rate of the direct-axis time constant is introduced to the electromagnetic oscilloscope 14

Figure 3A:
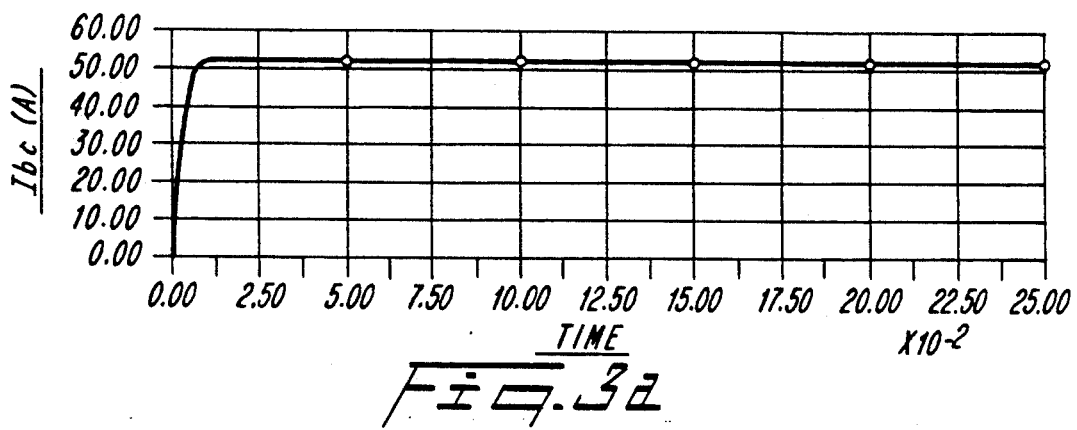
FIGS. 3(a), 3(b) and 3(c) are timing charts based on the simulation, showing the signals observed at various portions of the inventive apparatus.
Figure 3B:
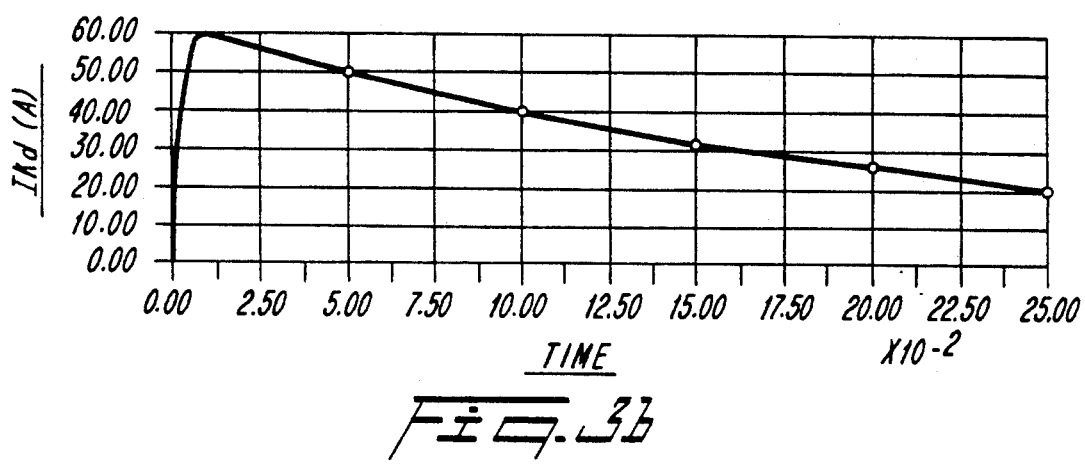
Figure 3C:
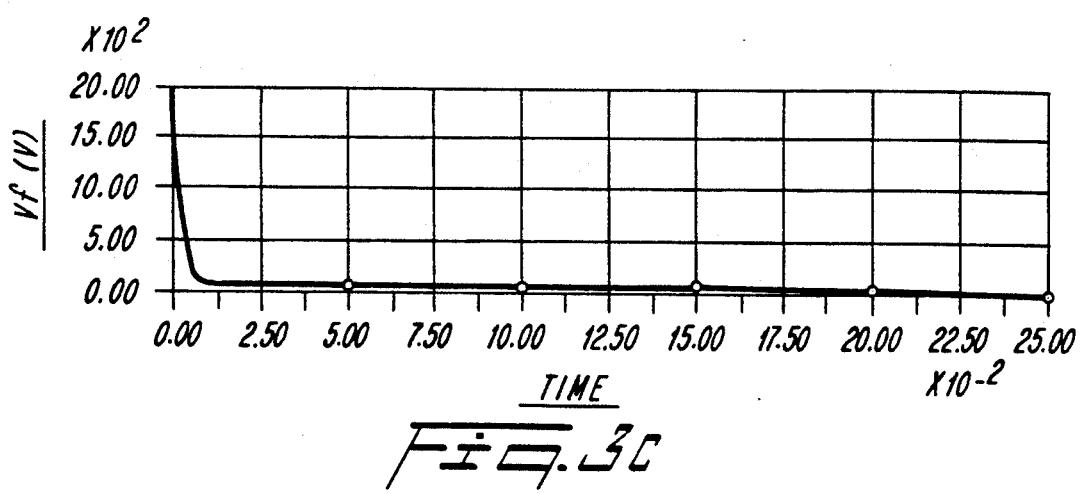

FIGS. 3a–3c show the result of simulation by a model of the electrical circuit shown in FIG. 1, of which FIG. 3(a) is the armature current $I_{bc}$, FIG. 3(b) is a representative value $I_{kd}$ of the current induced on the damper 9, and FIG. 3(c) is the voltage $V_f$ induced on the field winding. The armature current $I_{bc}$ rises immediately after the switch 6 has been closed, and thereafter it keeps a constant value. The representative value $I_{kd}$ of the induction current on the damper 9 resulting from the armature current conduction also rises immediately after the switch 6 has been closed, but it begins to diminish at a moderate rate determined by the direct-axis damper time constant after the armature current $I_{bc}$ reaches the steady state.

During the period when the representative value $I_{kd}$ induced on the damper 9 is decreasing gradually at the rate of the direct-axis damper time constant, only the representative value $I_{kd}$ and the d.c. armature current $I_{bc}$ flow in the motor. Since the d.c. armature current $I_{bc}$ does not vary with time, no induction voltage emerges across the field winding 8, and only an induction voltage caused by the changing representative value $I_{kd}$ exists on it. Accordingly, the voltage $V_f$ induced on the field winding 8 rises sharply at the transition of the closing switch 6, and it falls sharply to a small value after the armature current $I_{bc}$ has reached the constant value. After that, the voltage $V_f$ falls at a moderate rate of the direct-axis damper time constant.

Figure 4:
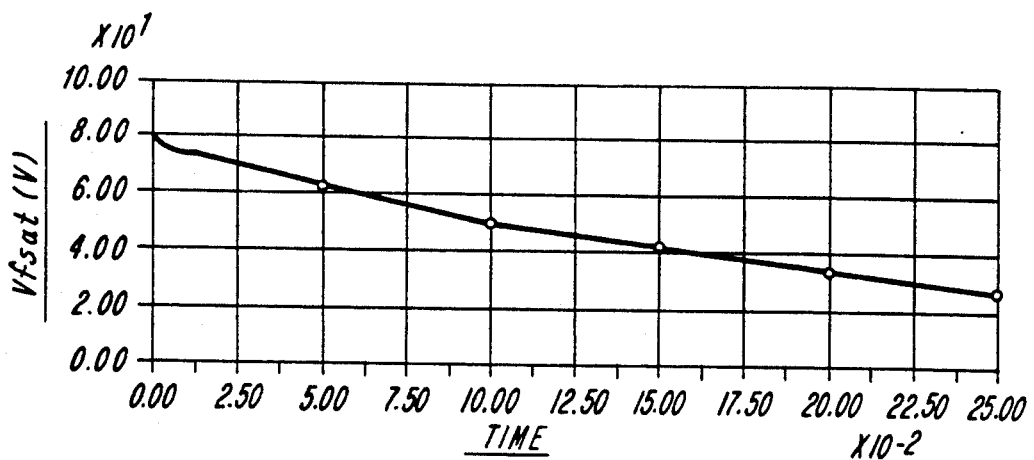
FIG. 4 is a timing chart based on the simulation, showing the output voltage of the saturation circuit of the inventive apparatus.
Figure 5:
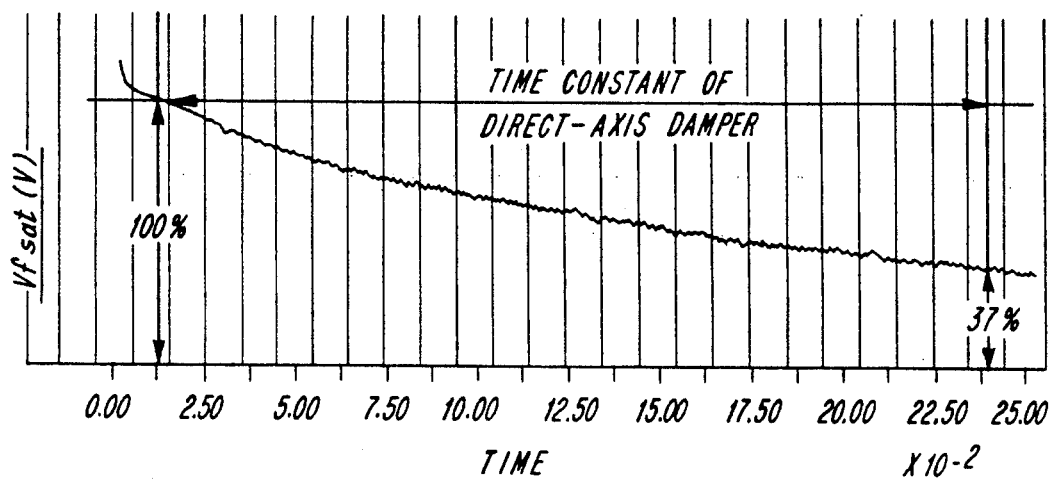
FIG. 5 is a timing chart showing the output voltage of the saturation circuit observed on an electromagnetic oscilloscope.
Figure 6:
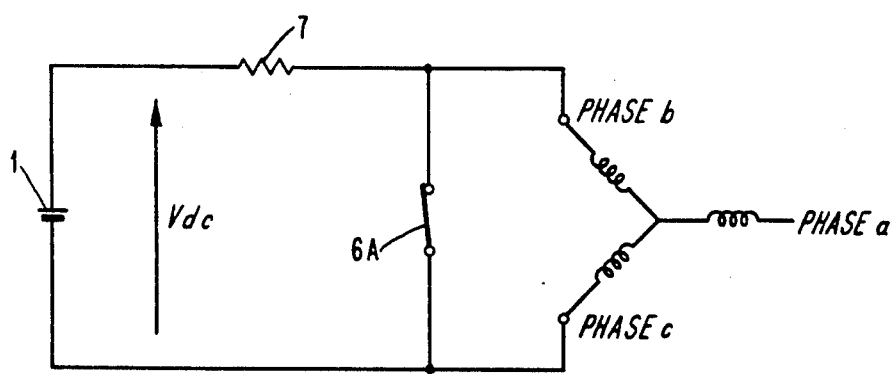
FIG. 6 is a schematic diagram showing the step current waveform generation circuit based on another embodiment of this invention.

FIG. 4 shows the result of simulation for the voltage $V_f$ shown in FIG. 3 which is fed through the saturation circuit 10 so that the transitional voltage component which emerges until the armature current $I_{bc}$ settles to the steady state is eliminated. The waveform is a series of plots on a fine voltage scale of the induction voltage on the field winding after it has fallen. The actual waveform is recorded with the electromagnetic oscilloscope 14 and used for the analysis of the direct-axis damper time constant. FIG. 5 shows a waveform recorded actually based on the present invention.

The waveform recorded by the electromagnetic oscilloscope 14 is approximated to an exponential function thereby to determine the time length until it decreases to a 1/e (e=2.72), i.e., 37%, level, and the resulting time length is the time constant of the direct-axis damper. The direct-axis damper time constant is set to the controller which is manufactured separately before it is shipped, and accordingly the conventional adjustment step carried out by combining the controller and motor can be eliminated.

Although in the foregoing embodiment the d.c. voltage $V_{dc}$ is applied to the armature windings through the resistor 7 by closing the switch 6, an alternative scheme is to maintain the application of the d.c. voltage $V_{dc}$ and open a switch 6A provided in a shunt circuit. This manner allows the switch 6A to be free from high voltage application, and thus facilitates the test.

Although in the foregoing embodiment the d.c. voltage $V_{dc}$ is applied to the armatrue windings through the resistor 7 by closing the switch 6, an alternative scheme is to have a steady state armature current $I_{bc}$ by application of the d.c. voltage $V_{dc}$, and then open the switch 6. This manner, which corresponds to the principle of test mentioned previously, may encounter the emergence of an unpredictable transitional voltage when the switch 6 is opened, but the test can be conducted without the resistor 7.

According to the present invention, as described above, a synchronous machine is placed to have its rotor made stationary at the position where a direct-axis magnetomotive force is generated by the current conduction between armatrue windings of two phases, with a winding of remaining phase being opened, and the time length after the current having an approximate step waveform conducted to the two windings has reached a certain value until a voltage induced on the field winding falls to a certain level is measured with a measuring means. Consequently, the time constant of the direct-axis damper of a synchronous machine can be measured accurately so that the optimal parameter value can be set as one of machine parameters to the controller, whereby the variable speed operation based on the high accuracy vector control can be accomplished.

The invention enables a stand-alone machine test, which is implemented when the machine has been assembled in the factory, to evaluate the direct-axis damper time constant which is one of machine parameters. Consequently, a test step for adjustment implemented by combining the controller and machine can be eliminated, and the expenditure of time and cost which would be expended for the combinational adjustment can be reduced.

What is claimed is:

1. An apparatus for measuring the time constant of the direct-axis damper of a synchronous machine, said synchronous machine having a rotor, a first phase winding, and a second phase winding, said apparatus comprising:
   means for applying a step voltage waveform across said first phase winding and said second phase winding when said rotor is at a position where a direct-axis magnetomotive force is generated by a resulting current flowing between said first phase winding and said second phase winding;
   means responsively connected to said first phase winding and said second phase winding for measuring a length of a time interval between a first time when a voltage across said first phase winding and said second phase winding reaches a first prescribed value and a second time when said voltage falls to a second prescribed value.

2. An apparatus as claimed in claim 1, wherein said synchronous machine has a third phase winding which remains open.

3. An apparatus as claimed in claim 1, wherein said first prescribed value is a value said voltage attains when said resulting current initially reaches a prescribed constant value.

4. An apparatus as claimed in claim 1 wherein said second prescribed value is a prescribed fraction of a difference between said first prescribed value and a threshold value.

5. An apparatus as claimed in claim 1 wherein said threshold value is a product of a steady-state current flowing through said first and second phase windings and an ohmic resistance of said phase windings.

6. An apparatus as claimed in claim 1 wherein said means for applying a step voltage waveform across said first phase winding and said second phase winding comprises a series combination of a dc voltage source, a switch, and a resistor.

7. An apparatus as claimed in claim 1 wherein said means for applying a step voltage waveform across said first phase winding and said second phase winding comprises a series combination of a dc voltage source and a resistor, in parallel with a switch.

8. An apparatus as claimed in claim 1, wherein said measuring means comprises an oscilloscope.

9. An apparatus as claimed in claim 1 further comprising a saturation circuit interposed between first and second phase windings and said measuring means.

10. An apparatus for measuring the time constant of the direct-axis damper of a synchronous machine, said synchronous machine having a rotor, a first phase winding, and a second phase winding, said apparatus comprising:
    means for applying a step voltage waveform across said first phase winding and said second phase winding when said rotor is at a position where a direct-axis magnetomotive force is generated by a resulting current flowing between said first phase winding and said second phase winding;
    means responsively connected to said first phase winding and said second phase winding for measuring a length of a time interval between a first time when a voltage across said first phase winding and said second phase winding reaches a first prescribed value as said resulting current reaches a prescribed constant value and a second time when said voltage falls to a second prescribed value which is a prescribed fraction of a difference between said first prescribed value and a threshold value which is a product of a steady-state current flowing through said first and second phase windings and an ohmic resistance of said phase windings.

11. An apparatus as claimed in claim 10 wherein said means for applying a step voltage waveform across said first phase winding and said second phase winding comprises a series combination of a dc voltage source, a switch, and a resistor.

12. An apparatus as claimed in claim 10 wherein said means for applying a step voltage waveform across said first phase winding and said second phase winding comprises a series combination of a dc voltage source and a resistor, in parallel with a switch.

13. An apparatus as claimed in claim 10 further comprising a saturation circuit interposed between first and second phase windings and said measuring means.

14. A method of measuring the time constant of the direct-axis damper of a synchronous machine, said synchronous machine having a rotor, a first phase winding, and a second phase winding, said apparatus comprising the steps of:

placing said rotor in a position at which a direct-axis magnetomotive force would be generated by current flowing between said first phase winding and said second phase winding;

applying a step voltage waveform across said first phase winding and said second phase winding;

measuring a length of a time interval between a first time when a voltage across said first phase winding and said second phase winding reaches a first prescribed value and a second time when said voltage falls to a second prescribed value.

15. A method as claimed in claim 14, wherein said synchronous machine also includes a stator and a field winding, and wherein said placing step comprises the steps of:

short-circuiting said first and second phase windings;

applying a dc current to said first and second phase windings;

applying a dc current to said field winding;

positioning the rotor at a position of equilibrium between magnetic forces induced in the stator and the rotor.

16. A method as claimed in claim 14, wherein said first prescribed value is a value said voltage attains when said resulting current initially reaches a prescribed constant value.

17. A method as claimed in claim 14 wherein said second prescribed value is a prescribed fraction of a difference between said first prescribed value and a threshold value.

18. A method as claimed in claim 17 wherein said threshold value is a product of a steady-state current flowing through said first and second phase windings and an ohmic resistance of said phase windings.

19. A method as claimed in claim 14 wherein said applying step comprises opening a switch in a series combination of a dc voltage source, said switch, and a resistor.

* * * * *